(12) United States Patent
Batz et al.

(10) Patent No.: US 10,175,296 B2
(45) Date of Patent: Jan. 8, 2019

(54) TESTING A BOARD ASSEMBLY USING TEST CARDS

(71) Applicant: Intel Corporation, Santa Clara, CA (US)

(72) Inventors: Joseph W. Batz, Beaverton, OR (US); Joseph R. Yuhas, Hillsboro, OR (US); Christopher Lewis, Hillsboro, OR (US); Elizabeth M. Yamada, Hillsboro, OR (US); Michael V. Hill, Hillsboro, OR (US); Ralph E. Rossknecht, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 33 days.

(21) Appl. No.: 15/372,296

(22) Filed: Dec. 7, 2016

(65) Prior Publication Data

US 2018/0156868 A1 Jun. 7, 2018

(51) Int. Cl.
*G06F 11/00* (2006.01)
*G01R 31/317* (2006.01)
*G01R 31/3177* (2006.01)

(52) U.S. Cl.
CPC ... *G01R 31/31701* (2013.01); *G01R 31/3172* (2013.01); *G01R 31/3177* (2013.01); *G01R 31/31703* (2013.01); *G01R 31/31713* (2013.01)

(58) Field of Classification Search
CPC ........ G01R 31/31701; G01R 31/31703; G01R 31/31713; G01R 31/3172; G01R 31/3177; G01R 31/318563; G01R 1/07307; G01R 1/07342; G01R 1/07371; G01R 31/2884; G01R 31/31905; G01R 31/31926; G01R 31/2851; G01R 31/2841; H01L 22/30
See application file for complete search history.

(56) References Cited

U.S. PATENT DOCUMENTS

| | | | | |
|---|---|---|---|---|
| 4,973,904 A | * | 11/1990 | Sonnek | G01R 31/31712 324/537 |
| 6,825,052 B2 | * | 11/2004 | Eldridge | G01R 1/07307 257/E23.021 |
| 8,127,187 B2 | * | 2/2012 | Xia | G06F 11/25 714/726 |
| 2005/0080581 A1 | * | 4/2005 | Zimmerman | G11C 5/04 702/117 |

(Continued)

*Primary Examiner* — Guerrier Merant
(74) *Attorney, Agent, or Firm* — Green, Howard, & Mughal LLP

(57) ABSTRACT

A testing arrangement is provided which comprises: a board assembly comprising (i) a first connector configured to receive a first component while the board assembly is to operate in a regular mode of operation and (ii) a second connector configured to receive a second component while the board assembly is to operate in the regular mode of operation; a first test card configured to be attached to the first connector while the board assembly is to operate in a test mode of operation; and a second test card configured to be attached to the second connector while the board assembly is to operate in the test mode of operation, wherein while the board assembly is to operate in the test mode of operation, the first test card is configured to communicate with the second test card to facilitate testing of the board assembly.

21 Claims, 9 Drawing Sheets

(56) References Cited

U.S. PATENT DOCUMENTS

| | | | |
|---|---|---|---|
| 2005/0237073 A1* | 10/2005 | Miller | G01R 1/07385 324/756.03 |
| 2005/0246594 A1* | 11/2005 | Co | G06F 11/2215 714/52 |
| 2006/0107154 A1* | 5/2006 | Bansal | G01R 31/31716 714/738 |
| 2009/0224784 A1* | 9/2009 | Pagani | G01R 31/3172 324/762.02 |
| 2010/0235700 A1* | 9/2010 | Song | G01R 31/31917 714/744 |
| 2011/0078525 A1* | 3/2011 | Xia | G01B 31/318563 714/731 |
| 2011/0291679 A1* | 12/2011 | Pagani | G01R 31/3172 324/750.01 |
| 2011/0302471 A1* | 12/2011 | Le-Gall | G01R 31/31717 714/733 |
| 2012/0326738 A1* | 12/2012 | Kim | G01R 31/318371 324/750.01 |
| 2014/0070834 A1* | 3/2014 | Pagani | B62M 25/04 324/756.03 |
| 2014/0253162 A1* | 9/2014 | Wang | G01R 31/2889 324/754.08 |
| 2014/0321285 A1* | 10/2014 | Chew | H04L 47/24 370/236 |
| 2015/0003505 A1* | 1/2015 | Lusted | H04L 25/4917 375/224 |
| 2016/0313147 A1* | 10/2016 | Potter | H04L 1/00 |

* cited by examiner

TESTING A BOARD ASSEMBLY USING TEST CARDS

BACKGROUND

A printed board assembly (PBA), e.g., a PBA configured as a motherboard, holds and allows communication between many of the crucial electronic components of a computing system, such as one or more central processing units (CPU), memory, etc., and provides connectors for various peripheral devices. A board assembly is to be tested, e.g., prior to the board assembly entering the production line. The components that are to be connected to a board assembly, e.g., CPUs, memory, peripherals, etc. can be actually connected to the board assembly to functionally test the board assembly. However, it may be desirable to test the board assembly prior to the CPUs, memory, peripherals, etc. are available for such testing.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
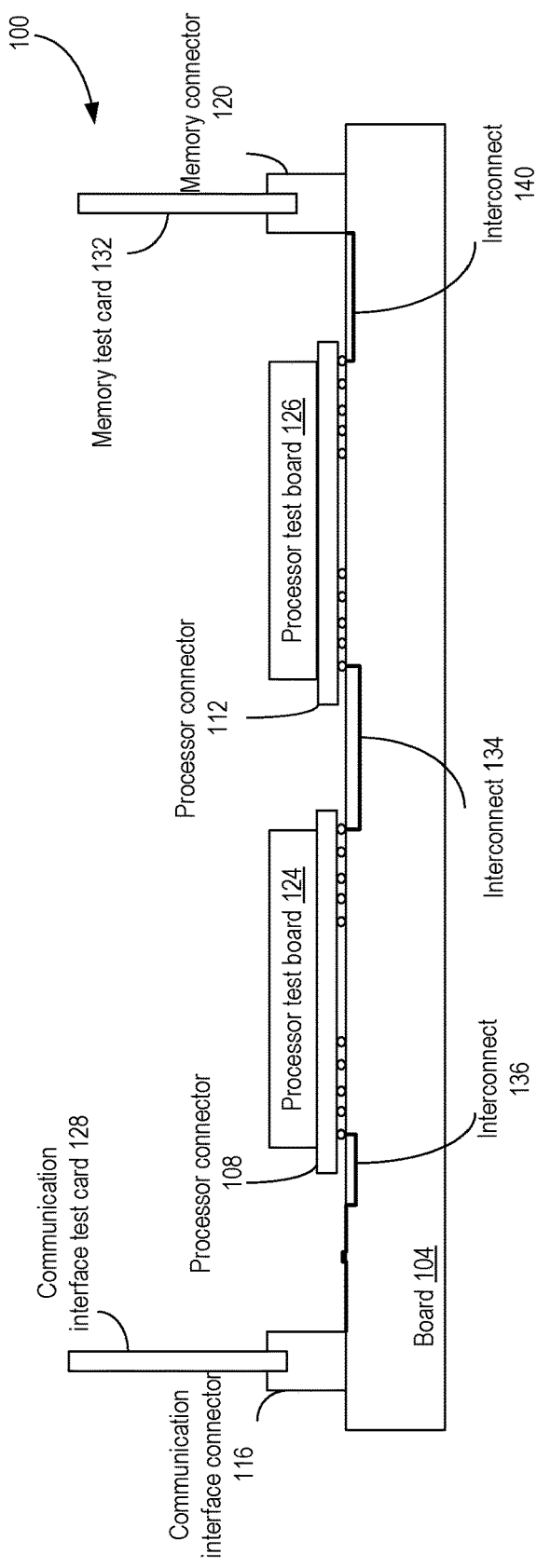
FIG. 1 illustrates an arrangement for testing a board assembly, according to some embodiments.

A board assembly may include one or more connectors to receive, for example, one or more corresponding integrated circuits (ICs) comprising one or more processors. The board assembly can also have connectors to receive memory cards, Peripheral Component Interconnect Express (PCIe) cards, etc. The board assembly can be tested functionally after attaching the components, e.g., the IC comprising the one or more processors, the memory cards, the PCIe cards, etc., to the board assembly. However, such functional testing can be performed only after the ICs, the memory cards, and the PCIe cards are fully developed and manufactured, which usually happens at a later stage of a design cycle.

In an example, a board assembly can be tested before the IC, the memory cards, and the PCIe cards are manufactured or are ready for being tested in conjunction with the board assembly. In some embodiments, while the board assembly is to be tested, a processor test board can be connected to a processor connector or socket of the board assembly, where the processor connector is generally configured to receive a IC including a CPU. Also, while the board assembly is to be tested, a memory test card can be connected to a memory connector or a socket of the board assembly, where the memory connector is generally configured to receive a memory card during a regular operation of the board assembly. The processor test board and the memory test card communicate with each other to test the board assembly. For example, the memory test card transmits a pseudorandom pattern to the processor test board, which the processor test board loops back, e.g., re-transmits back to the memory test board. The memory test board compares the pseudorandom pattern being transmitted with the pseudorandom pattern being received back from the processor test board. Matching of the two patterns implies that the processor connector, the memory connector, and the signal traces between these two connectors are functioning as intended. On the other hand, a mismatch can be an indication of a possible fault in one or more of the processor connector, the memory connector, or the signal traces between these two connectors.

Although the above example discusses a specific case of testing a processor connector and a memory connector, any two connectors of the board assembly can be similarly tested. For example, the processor connector, a PCIe connector, and an interconnection in between can also be tested in a similar manner.

In some embodiments, the testing of the connectors can be used for both direct current (DC) and alternating current (AC) coupled circuits. For example, one or more traces (e.g., a PCIe trace) on a board assembly may have a coupling capacitor that may block DC voltages, but allow a pseudo-random pattern to propagate through the capacitor.

There are many technical effects of the various embodiments. For example, the test cards and the test boards are relatively easy to design and manufacture, (e.g., compared to designing and manufacturing the IC including the CPU, the memory cards, and/or the PCIe cards, because the test cards and the test boards are much simpler in design and are designed solely or mainly for purposes of testing the board assembly). Accordingly, the board assembly can be tested using these test cards and test boards fairly early in the design phase, e.g., much earlier than known good actual components (e.g., known good ICs, memories, etc.) are available for functionally testing the board assembly. This results in identifying possible faults in the board assembly early on in the design cycle, and rectification of such faults early on.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "bottom," "over," ":under," and the like in the description and the claims, if any, are used for descriptive purposes and not necessarily for describing permanent relative positions.

FIG. 1 illustrates an arrangement 100 for testing a board assembly 104, according to some embodiments. The board assembly 104 (henceforth also referred to as "board 104") can be, for example, a Printed Circuit Board Assembled (PBA), where one or more components are connected to a Printed Circuit Board (PCB). In some embodiments, the board 104 is a mother board of a computing system.

In some embodiments, the board 104 comprises one or more connectors, in which various components of a computing system can be connected or attached to. For example, the board 104 comprises a processor connector 108 and a processor connector 112 (henceforth also referred to as "connector 108" and "connector 112," respectively). The connectors 108 and 112, for example, are sockets or slots where two corresponding ICs comprising two corresponding processors can be connected, inserted or attached.

In an example, the connector 108 is designed for a specific type of processor IC. For example, a pin configuration of the connector 108 complements that of the specific type of processor IC, such that a processor IC of the specific type can be inserted or attached to the connector 108. Similarly, the connector 112 is also designed for another specific type of processor IC. The processor ICs, for which the connectors 108 and 112 are designed, are not illustrated in FIG. 1. Instead, as discussed in further details herein below, in FIG. 1, two processor test boards 124 and 126 are respectively attached to or inserted within the connectors 108 and 112. Although two processor connectors 108 and 112 are illustrated in FIG. 1, any other appropriate number of processor connectors (e.g., one, three, four, etc.) can be included in the board 104.

The board 104 further comprises one or more memory connecters, e.g., a memory connector 120 (henceforth also referred to as "connector 120"). Although a single memory connector 120 is illustrated in FIG. 1, the board 104 is likely to have multiple such memory connectors. The connector 120, for example, is a socket or a slot in which a memory card can be connected or attached to, although FIG. 1 does not illustrate a memory card connected to the memory connector 120. Instead, as discussed in further details herein below, in FIG. 1, a memory test card 132 is attached to the connector 120.

The board 104 further comprises one or more communication interface connectors, e.g., a communication interface connector 116 (henceforth also referred to herein as "connector 116"). Although a single communication interface connector 116 is illustrated in FIG. 1, the board 104 is likely to have multiple such communication interface connectors. In some embodiments, the connector 116, for example, is a socket or a slot in which a PCIe card or a PCI card can be inserted. In such embodiments, the connector 116, for example, is a PCI connector or a PCIe connector. FIG. 1 does not illustrate a PCIe or a PCI card being connected to the connector 116. Instead, as discussed in further details herein below, in FIG. 1, a communication interface test card 128 is attached to the slots of the connector 116.

In some embodiments, the various connectors in the board 104 are connected via interconnects, which can be traces, one or more bus, and/or other connections within the board 104. Although FIG. 1 illustrates only some example interconnects, the board 104 may include numerous other interconnects and connections between various connectors in the board 104. For example, the connector 108 is connected to the connector 112 via a interconnect 134. The interconnect 134, for example, represent a point-to-point processor interconnect between the connectors 108 and 112, and can be implemented as one or more traces, signal lines, and/or buses on the board 104. In an example, the interconnect 134 is an UltraPath Interconnect (UPI)® developed by Intel Corporation®.

In some embodiments, the connector 116 is connected to the connector 108 via a interconnect 136. The interconnect 136, for example, can be implemented as one or more traces, buses, or signal lines on the board 104. In some embodiments, the connector 112 is connected to the connector 120 via a interconnect 140. The interconnect 140, for example, can be implemented as one or more traces, buses, etc. on the board 104.

In an example, it may be desirable to test the board 104, including the connectors 108, 112, 116, 120, the interconnects 134, 136, 140, and/or other components of the board 104 not illustrated in FIG. 1. In an example, a functional testing of the board 104 can be performed, where one or more processor ICs, one or more memory, and/or one or more communication interfaces are coupled to the various connectors of the board 104, and the board 104 is tested. However, such processor ICs, memory, and/or communication interfaces may be developed during a later stage of development of a computing system, and it may be desired to test the board 104 even before the processor ICs are fully developed, manufactured and ready for testing. In some embodiments and as discussed in more details herein below, one or more test cards or test boards are used to test the board 104, e.g., even before the processor ICs, memory, communication interfaces, etc. are available for functional testing of the board 104.

For example, FIG. 1 illustrates a processor test board 124 (henceforth also referred to as "test board 124," and also as "test card 124") and a processor test board 126 (henceforth also referred to as "test board 126," and also as "test card 126"). In some embodiments, the test boards 124 and 126 are configured to be inserted or attached to the connectors 108 and 112, respectively. For example, the connector 108 is configured to receive a processor IC of a first type of processor IC (not illustrated in FIG. 1) during a regular operation of the board 104, and the test board 124 and the first type of processor IC have substantially similar configuration of pins. For example, the configuration of pins in the first type of processor IC and the test board 124 are substantially similar such that both a processor IC of the first type of processor IC or the test board 124 can be attached to the connector 108 at a given time.

Similarly, for example, the connector 112 is configured to receive a processor IC of a second type of processor IC (not illustrated in FIG. 1) during a regular operation of the board 104. In some embodiments, the test board 126 and the second type of processor IC have substantially similar configuration of pins such that both a processor IC of the second type of processor IC or the test board 126 can be attached to the connector 112 at a given time.

In some embodiments, the connector 116 is configured to receive a communication interface test card 128 (also referred to herein as "test card 128") while the board 104 is being tested. As discussed herein above, in an example, the connector 116 is a PCIe connector configured to receive a PCIe card. In such an example, the test card 128 has substantially similar pin configuration as a PCIe card, such that the test card 128 can be attached to the connector 116, e.g., to test the board 104. As discussed herein earlier, although a single connector 116 is illustrated in FIG. 1, the board 104 is likely to have multiple such communication interface connectors—accordingly, in some embodiments, each of such multiple communication interface connectors is configured to receive the test card 128 (or other test cards similar to the test card 128).

In some embodiments, the connector 120 is configured to receive a memory test card 132 (also referred to herein as "test card 132"). As discussed herein above, in an example, the connector 120 is a memory connector configured to receive a memory card during a regular operation of the board 104. In such an example, the test card 132 has substantially similar pin configuration as the memory, such that the test card 132 can be attached to the connector 120, e.g., to test the board 104. As discussed herein earlier, although a single connector 120 is illustrated in FIG. 1, the board 104 is likely to have multiple such memory connectors—accordingly, in some embodiments, each of such multiple memory connectors is configured to receive the test card 132 (or other test cards similar to the test card 132).

The board 104, in an example, operates, at any given time, in one of two modes of operation. For example, during manufacturing or testing of the board 104, the board 104 operates in a test mode of operation, during which one or more of the test boards 124 and 126, and the test cards 128 and 132 are inserted in the corresponding connectors, as illustrated in FIG. 1. During a normal or regular operation of the board 104 (which, for example, occurs subsequent to the test mode), the test boards 124 and 126 and the test cards 128 and 132 are removed from the board 104, and are replaced by processor ICs, memory cards, and communication interfaces attached to the respective connectors.

Figure 2:
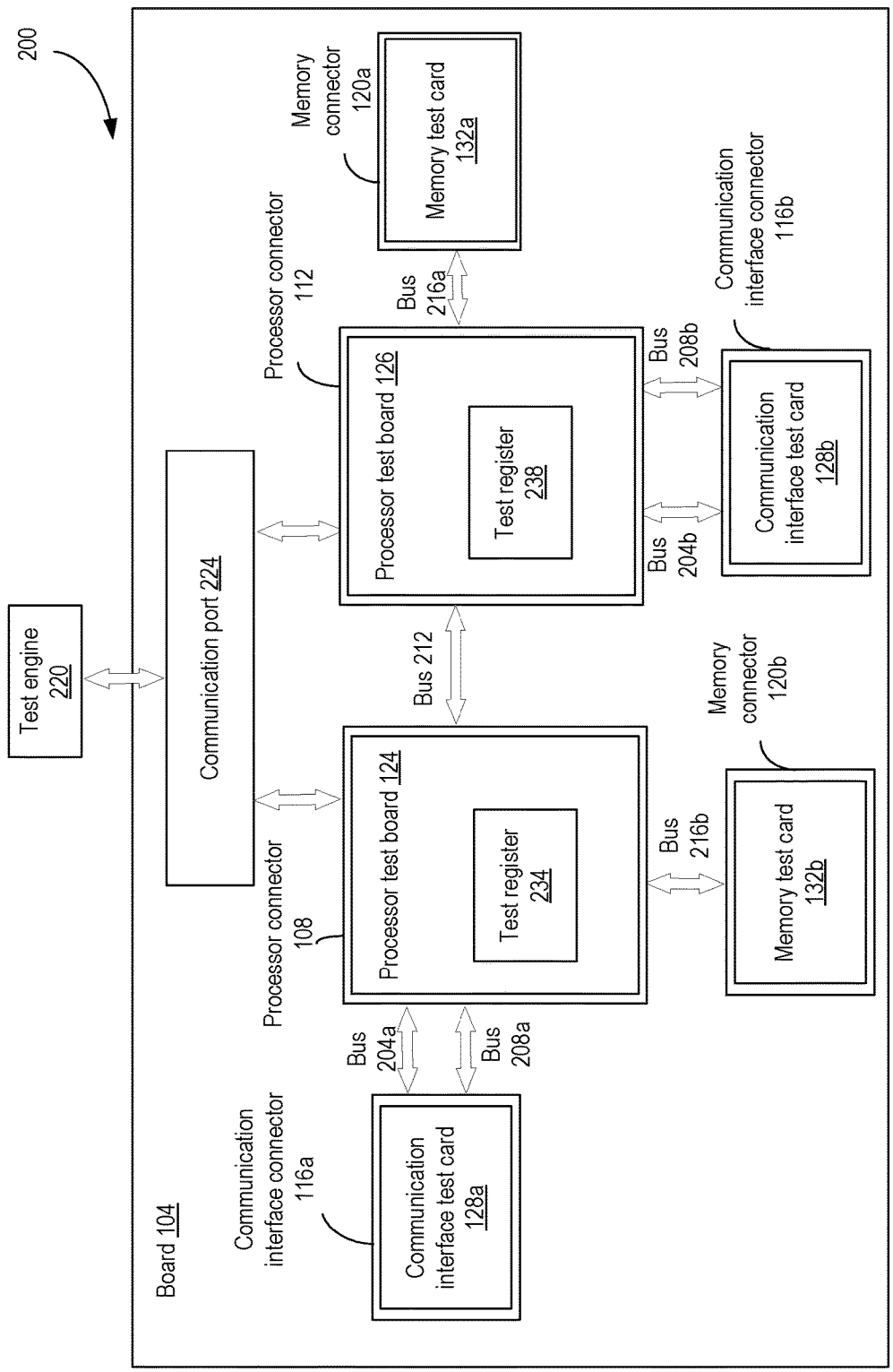
FIG. 2 schematically illustrates another arrangement for testing the board assembly of FIG. 1, according to some embodiments.

FIG. 2 schematically illustrates an arrangement 200 for testing the board 104 of FIG. 1, according to some embodiments. As discussed with respect to FIG. 1, during testing of the board 104, the board 104 is configured to receive the test boards 124 and 126, as illustrated in FIG. 2. Furthermore, as previously discussed herein, although FIG. 1 illustrates a single communication interface test card 128 inserted in the board 104, multiple such communication interface test cards can be inserted in multiple communication interface connectors of the board 104. FIG. 2 illustrates two example communication interface test cards 128a and 128b (henceforth also referred to as "test card 128a" and "test card 128b") respectively inserted in two communication interface connectors 116a and 116b of the board 104.

In some embodiments, the connector 108 (e.g., to which the test board 124 is attached) is connected to the connector 116a (e.g., to which the test card 128a is attached) via buses 204a and 208a, and the connector 112 (e.g., to which the test board 126 is attached) is connected to the connector 116b (e.g., to which the test card 128b is attached) via buses 204b and 208b. The buses 204a, 204b, 208a, and 208b correspond to the interconnect 136 of FIG. 1. In an example where the test cards 128a and 128b are PCIe cards, each of the buses 204a, 204b, 208a, 208b may be, for example, one of a PCIe bus, a direct media interface (DMI) bus developed by Intel Corporation®, and/or the like. Although FIG. 2 illustrates two communication interface test cards (e.g., test cards 128a and 128b), any other appropriate number of communication interface test cards can be connected to the board 104, e.g., depending on the configuration of the board 104.

As previously discussed herein, although FIG. 1 illustrates a single memory test card 132 inserted in the board 104, multiple such memory test cards can be inserted in multiple memory connectors of the board 104. FIG. 2 illustrates two example memory test cards 132a and 132b (henceforth also referred to respectively as "test card 132a" and "test card 132b") respectively inserted in two memory connectors 120a and 120b of the board 104. In some embodiments, the connector 120a is connected to the connector 112 via a bus 216a, and the connector 120b is connected to the connector 108 via a bus 216b. The buses 216a and 216b correspond to the interconnect 140 of FIG. 1. In an example, the buses 216a and 216b may be, for example, memory buses. Although FIG. 2 illustrates two memory test cards (e.g., test cards 132a and 132b), any other appropriate number of memory test cards can be connected to the board 104, e.g., depending on the configuration of the board 104.

In some embodiments, one or both of the test boards 124 and 126 communicate with a test engine 220 that is external to the board 104. In an example, the test engine 220 communicates with one or both of the test boards 124 and 126 via an appropriate communication port 224 on the board 104. The communication port 224 is, for example, a Universal Serial Bus (USB) port of the board 104, a Joint Test Action Group (JTAG) port of the board 104, and/or the like. The test engine 220 can be developed by the manufacturer or developer of the board 104, or may be developed by a third-party vendor. In some embodiments, the test engine 220 controls testing of the board 104, receives data from the test boards 124 and 126 while the board 104 is being tested, and analyzes the received data to identify potential faults and/or performance issues of the board 104.

In some embodiments, the test boards 124 and 126 respectively comprise a test register 234 and a test register 238, which facilitate testing of the board 104. Although each of the test boards 124 and 126 are illustrated in FIG. 2 to include corresponding test registers, in some other embodiments, only one of the test boards 124 and 126 can include a test register (e.g., in such an embodiment, the test registers 234 and 238 can be combined as a single test register, and included in one of the test boards 124 and 126).

In some embodiments, the test registers 234 and 238 include data that can be selectively programmed, e.g., via the test engine 220. For example, based on a test that is to be performed on the board 104, the test engine 220 programs the test registers 234 and 238 via the communication port 224.

In some embodiments, for individual test cards (e.g., individual memory test cards 132a, 132b, etc.) attached to the board 104, the test registers 234 and/or 238 have a corresponding bit that determines whether the test card is to be tested while the board 104 is being tested. In an example, the test register 234 included in the test board 124 stores bits corresponding to the memory test cards attached to the test board 124 (e.g., memory test card 132b), while the test register 238 included in the test board 126 stores bits corresponding to the memory test cards attached to the test board 126 (e.g., memory test card 132a).

In some embodiments, for the bus 212 connecting the connectors 108 and 112 (e.g., where the bus 212 corresponds to the interconnect 134 of FIG. 1), the test register 234 (or the test register 238) stores one or more bits that determine whether the bus 212 and/or one or more ports associated with the bus 212 are to be tested. For example, if the bus 212 has three corresponding ports, the test register can have three bits corresponding to the bus 212, where each of the three bits determines whether the corresponding port is to be tested.

In some embodiments, for individual test cards (e.g., individual communication interface test cards 128a, 128b, etc.), the test registers 234 and/or 238 also determine a mode of operation of the test card. For example, as will be discussed in more detail herein later, a communication interface test card (e.g., the test card 128a) can operate as a loop back test card, as a regular test card, can be in a tri-state mode, or may not participate in the testing of the board 104. In some embodiments, for individual communication interface test cards, a test register has two corresponding bits that determine whether the communication interface test card is operating as a loop back test card, as a regular test card, in a tri-state mode, or is not being tested.

In an example, the test register 234 included in the test board 124 stores bits corresponding to the communication interface test cards attached to the test board 124 (e.g., communication interface test card 128a), while the test register 238 included in the test board 126 stores bits corresponding to the communication interface test cards attached to the test board 126 (e.g., communication interface test card 128b).

In an example, a communication interface connector (e.g., the connector 116a) can have 16 ports. In another example, the 16 ports of the connector 116a can be bifurcated in two sets (e.g., such that two separate connectors exist instead of a single connector 116a), where each set has 8 ports—in such an example, two communication interface test cards (and eventually two PCIe cards, if the connector 116 is a PCIe connector) can be inserted in the two sets. In yet another example, the 16 ports of the connector 116a can be divided in four sets, where each set has 4 ports—in such an example, four communication interface test cards (and eventually four PCIe cards, if the connector 116 is a PCIe connector) can be inserted in the four sets of connectors. In an example, whether the connector 116a has 16 ports, or whether the connector 116a is sub-divided into multiple connectors having smaller number of ports, is based on a design or configuration of the board 104. However, the test board 124 and the test register 234 are configured to be compatible with a 4 port, an 8 port, or a 16 port communication interface connector. For example, the test register 234 has an option to specify a number of ports in individual communication interface connectors, and also has an option to selectively program individual communication interface connectors. For example, for each 16 ports of a communication interface connector (e.g., the connector 116a), the test register 234 can have eight corresponding bits. For example, if the connector 116a is divided in four connectors each having four ports, each smaller connector is assigned two bits that determine a mode of the above discussed four modes in which the corresponding connector can operate.

In some embodiments, the board 104 is tested using PRBS, e.g., a sequence of pseudo random bits generated by a PRBS generator. PRBS testing can be employed to test various connectors, ports, traces, and/or other components of the board 104.

Figure 3:
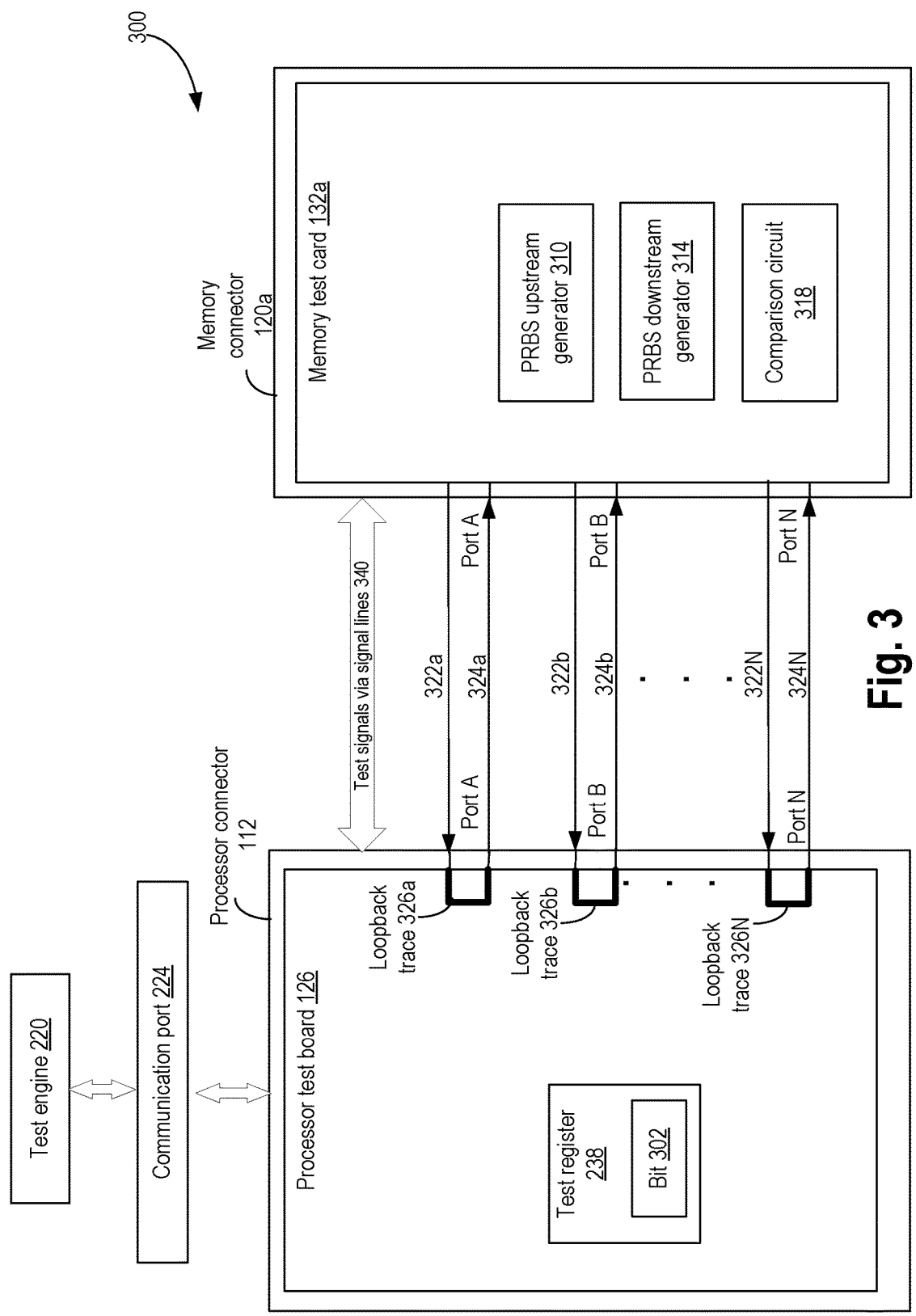
FIG. 3 illustrates an arrangement for Pseudo Random Bit Sequence (PRBS) testing of a board assembly using a memory test card, according to some embodiments.

FIG. 3 illustrates an arrangement 300 for PRBS testing of the board 104 using a memory test card (e.g., the test card 132a), according to some embodiments. In the arrangement 300, the test board 126 within the connector 112 communicates with the memory test card 132a within the connector 120a. As discussed with respect to FIG. 2, the test board 126 comprises a test register 238. In some embodiments, the test register 238 comprises a bit 302 corresponding to the test card 132a, where the bit 302 can be programmed by, for example, the test engine 220. When the test card 132a is to be used for testing, the bit 302 is enabled (e.g., set to 1). On the other hand, when the test card 132a is not to be used for testing, the bit 302 is disabled (e.g., set to 0).

In an example, the connector 120a comprises ports A, B, N, where N is a positive integer. For example, as discussed with respect to FIGS. 1 and 2, the test card 132a mimics the pin configuration of a memory card (not illustrated in FIG. 3) that is to be inserted in the connector 120a. The memory card has N ports corresponding to the ports A, . . . , N, and accordingly, the test card 132a is also designed to have N corresponding ports. For example, the pins of the N ports of the test card 132a is attached to the corresponding pins of the N ports of the connector 120a, e.g., as the test card 132a is inserted within or attached to the connector 120a. Each port of the connector 120a is configured to communicate with a corresponding port of the connector 112, where the connector 112 also has N ports, e.g., ports A, B, . . . , N. For example, pins of the N ports of the connector 112 is attached to the corresponding pins of the N ports of the test board 126, e.g., as the test board 126 is inserted within or attached to the connector 112.

For example, an output pin of port A of the connector 120a is connected to an input pin of port A of the connector 112 via a signal line 322a, an output pin of port B of the connector 120a is connected to an input pin of port B of the connector 112 via a signal line 322b, an output pin of port N of the connector 120a is connected to an input pin of port N of the connector 112 via a signal line 322N, and so on. Similarly, an output pin of port A of the connector 112 is connected to an input pin of port A of the connector 120a via a signal line 324a, an output pin of port B of the connector 112 is connected to an input pin of port B of the connector 120a via a signal line 324b, an output pin of port N of the connector 112 is connected to an input pin of port N of the connector 120a via a signal line 324N, and so on. The signal lines 322a, 322b, 322N, 324a, 324b, 324N correspond to the bus 216a illustrated in FIG. 2.

In some embodiments, for individual ports A, ..., N of the test board 126, a corresponding input pin is connected to a corresponding output pin via a corresponding loopback trace 326 on the test board 126. For example, an input pin and an output pin of port A on the test board 126 is connected via a loopback trace 326a, an input pin and an output pin of port N of the test board 126 is connected via a loopback trace 326N, and so on. The loopback traces 326 are traces within the test board 126 that connects an input pin and an output pin of a port. Accordingly, a signal from, for example, an output pin of port A of the test card 132a travels via signal line 322a, loopback trace 326a on the test board 126, and via signal line 324a to an input pin of port A of the test card 132a.

In some embodiments, the test card 132a comprises a PRBS upstream generator 310 (henceforth also referred to as "generator 310") and a PRBS downstream generator 314 (henceforth also referred to as "generator 314"). Each of the generators 310 and 314 generates a corresponding sequence of random or pseudo random bits, e.g., based on a seed. Thus, for example, if a same seed is used in both the generators 310 and 314, both the generators 310 and 314 will generate the same sequence of random or pseudo random bits.

In some embodiments, the ports A, ..., N of the connectors 120a and 112 are tested sequentially. For example, initially the port A of the connectors 120a and 112 are tested (e.g., along with testing the signal lines 322a and 324a). Subsequently, the port B of the connectors 120a and 112 are tested (e.g., along with testing the signal lines 322b and 324b). This process is repeated until all the ports of the connectors 112 and 120a are tested.

In some embodiments, while testing the port A of the connectors 120a and 112, the remaining ports of the connectors 120a and 112 and the signal lines 322b, 322N, 324b, ..., 324N are held at high logic (e.g., at 1). Furthermore, while testing the port A of the connectors 120a and 112, the generator 310 generates a sequence of pseudo random bits using, for example, a specific seed, e.g., seed A. The test card 132a transmits the sequence via the output pin of the port A of the connector 120a. The sequence of pseudo random bits is transmitted via the signal line 322a, via the loopback trace 326a of the test board 126, via the signal line 324a, and is eventually received by the test card 132a via the input pin of the port A of the connector 120a. The generator 314 also generates a sequence of pseudo random bits using the same seed A (e.g., which was used by the generator 310 to generate the sequence of pseudo random bits). In an example, the two generators 310 and 314 generate the same sequence of pseudo random bits, e.g., because the two sequences are generated using the same seed. Accordingly, ideally, e.g., if the port A of the connectors 120a and 112, and the signal lines 322a and 324a are operating as intended, the sequence of pseudo random bits generated by the generator 314 will substantially match with the sequence received over the signal line 324a. In some embodiments, the generator 314 is initially stopped or not activated (e.g., does not generate any pseudorandom bits when the generator 310 starts generating pseudorandom bits, which are transmitted to the test board 126). Upon detecting a specific pattern within the pseudorandom bits received over the signal 324a, the generator 314 is enabled or activated to generate pseudorandom bits. This establishes a synchronization between the generator 310 and the generator 314.

Thus, the sequence generated by the generator 314 may be a delayed version generated by the generator 310, e.g., to account for the delay in the transmission of the sequence via the signal line 322a, the loopback trace 326a, and the signal line 324a.

The test card 132a further comprises a comparison circuit 318. The comparison circuit 318 is configured to compare the sequence of pseudo random bits generated by the generator 314 with the sequence of pseudo random bits received over the signal line 324a. In some embodiments and as discussed above, the generator 314 generates the sequence of pseudo random bits with some delay relative to the sequence of pseudo random bits generated by the generator 310 (e.g., to account for the delay in the transmission of the sequence via the signal lines 322a, 324a, and the loopback trace 326a). In some embodiments, the comparison circuit 318 is activated, e.g., starts comparing, when the generator 314 starts generating the pseudorandom bits. For example, the comparison circuit 318 compares the sequence of pseudo random bits generated by the generator 314 with the sequence of pseudo random bits received over the signal line 324a. If the two sequence matches, this implies that the port A of the connectors 112 and 120a, and the signal lines 322a and 324a are operating as intended. On the other hand, if the two sequence does not match, this implies a possible fault in one or more of the port A of the connectors 112 and 120a, and the signal lines 322a and 324a. In some embodiments, the result of comparison is transmitted to the test engine 220, where the test engine 220 analyses the results to infer whether the port A of the connectors 112 and 120a are operating as intended.

In some embodiments and as illustrated in FIG. 3, the connectors 112 and 120a may also communicate test signals via signal lines 340. During a regular mode of operation of the board 104 (e.g., when a processor IC is attached to the connector 112 and a memory card is attached to the connector 120a), the signal lines 340, for example, are used to transmit signals associated with the operation of the memory card (e.g., signals associated with transmitting a memory command, an acknowledgement command, or the like) between the memory and the processor IC. However, while testing the board 104 (e.g., when the test board 126 is attached to the connector 112 and the test card 132a is attached to the connector 120a), the signal lines 340 are used for transmitting signals associated with testing the board 104. The test signals can be of any appropriate type, e.g., to indicate a start of a test, to acknowledge a completion of a test, to transmit a result of the test from the comparison circuit 318 to the test board 126, etc.

In some embodiments and although not illustrated in FIG. 3, the generators 310 and 314, and the comparison circuit 318 can be placed within the test board 126, e.g., instead of the test card 132a. In such embodiments, the loopback traces 326 may be placed within the test card 132a. That is, the position of the generators 310, 314, the circuit 318, and the loopback traces 326 can be reversed.

In some embodiments and although not illustrated in FIG. 3, the test card 132a can include a single PRBS generator (e.g., generator 310). For example, the single generator can generate and transmit the sequence of pseudorandom bits, and temporarily store the sequence of bits in a memory or register within the test card 132a. The comparison circuit 318 can then compare the sequence of bits received over the signal line 324a with the sequence of bits stored in the memory or register within the test card 132a.

In some embodiments, the data pattern, the data rate, and/or the length of the sequence of pseudorandom bits generated by the generators 310 and 314 can be programmed via the test engine 220. Merely as an example, the test card 132a can support a data rate between 6 kilobytes (kb) per second (Kbps) and 200 megabits per second (Mbps), and the test engine 220 can set an appropriate data rate for testing. In some embodiments, the test engine 220 can program the data pattern by, for example, appropriately selecting a seed used by the generators 310 and 314 for generating the sequence of bits. In some embodiments, the sequence of pseudorandom bits can be repeating in nature, and the length of the sequence of pseudorandom bits can also be programmed by the test engine 220. For example, length of the sequence of pseudorandom bits can be set between 10 bits and 1 million bits. In some embodiments, the length of the sequence of pseudorandom bits has to be sufficiently long enough for the comparison circuit 318 to effectively compare the two sequences.

Figure 4A:
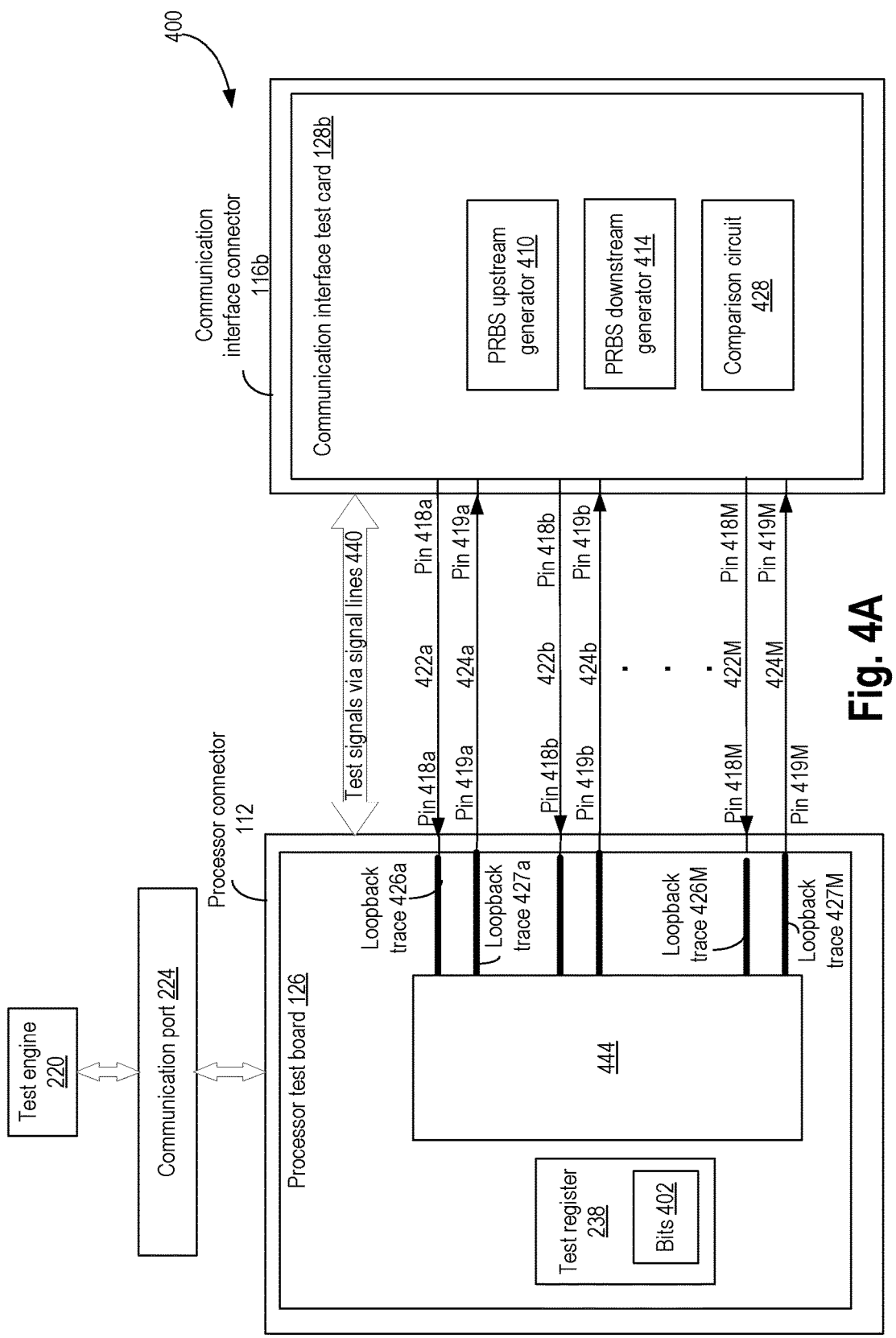
FIG. 4A illustrates an arrangement for PRBS testing of a board assembly using a communication interface test card, according to some embodiments.

FIG. 4A illustrates an arrangement 400 for PRBS testing of the board 104 using a communication interface test card (e.g., the test card 128b), according to some embodiments. In the arrangement 400, the test board 126 within the connector 112 communicates with the test card 128b within the connector 116b. The arrangement 400 is at least in part similar to the arrangement 300 of FIG. 3, although the memory test card 132a of FIG. 3 is replaced with the communication interface test card 128b in FIG. 4A.

In some embodiments, the test register 238 comprises bits 402 corresponding to the test card 128b, where the bits 402 can be programmed by, for example, the test engine 220. In an example, the bits 402 comprises two bits, and is programmed to indicate whether the test card 128b is used as a loop back test card, as a regular test card, in a tri-state mode, or is not participating in the testing of the board 104. While the test card 128b is used in a PRBS test, the bits 402 are programmed to indicate that the test card 128b is used as a regular test card.

In an example, the connector 116b comprises pins 418a, . . . , 418M, 419a, . . . , 419M, coupled to signal lines 422a, . . . , 422M, 424a, . . . , 424M, respectively. Each of the test card 128b, the connector 112, and the test board 126 are also assumed to have corresponding pins. Merely as an example, it is assumed that the pins 418a, . . . , 418M transmits signal from the connector 116b to the connector 112 via the signal lines 422a, . . . , 422M, and the pins 419a, . . . , 419M receives signal from the connector 112 to the connector 116b via the signal lines 424a, . . . , 424M.

Due to the nature of a PCIe protocol (i.e., assuming that a PCIe card is to be attached to the connector 116b during a regular operation of the board 104), a PCIe card (e.g., that is attached to the connector 116b during the regular operation) can transmit a request or data via signal line 422a. A response can be received from a processor (e.g., that is attached to the connector 112) via the signal line 424a, or via another signal line (e.g., signal line 424b). Whether the response is received via the signal line 424a or 424b is, for example, based on a configuration of the PCIe card, a PCIe protocol used, a configuration of the processor, a configuration of the board 104, and/or the like. Accordingly, unlike FIG. 3 (e.g., where the loopback traces 326 were hardwired to connect two dedicated pins of a port), the pins 418a, . . . , 418M, 419a, . . . , 419M in the processor test board 126 are looped back via a programmable component 444 (e.g., a reconfigurable switch). The pins 418a, . . . , 418M, 419a, . . . , 419M in the processor test board 126 are connected to the component 444 via loopback traces 426a, . . . , 426M, 427a, . . . , 427M.

In some embodiments, the component 444 selectively connects the pins of the test board 126 depending on a configuration of the board 104 and/or the connector 116b. For example, the test board 126 is designed to be compatible with a variety of configurations of the board 104 and connector 116b. For example, if a configuration requires that the pin 418a is to be connected to the pin 419a, the component 444 connects the pin 418a to the pin 419a. On the other hand, if the configuration requires that the pin 418a is to be connected to the pin 419b, the component 444 connects the pin 418a to the pin 419b. Thus, the component 444 acts as a reconfigurable or programmable switch, e.g., based on test signals received from the test engine 220.

Similar to FIG. 3, in some embodiments, the test card 128b of FIG. 4A includes a PRBS upstream generator 410 (henceforth also referred to as "generator 410") and a PRBS downstream generator 414 (henceforth also referred to as "generator 414"). Each of the generators 410 and 414 generates a corresponding sequence of random or pseudo random bits, e.g., based on a seed. Thus, for example, if a same seed is used in both the generators 410 and 414, both the generators 410 and 414 will generate the same sequence of random or pseudo random bits.

In some embodiments, the pins 418a, . . . , 418M, 419a, . . . , 419M are tested sequentially. Merely as an example, initially a pair of pins (e.g., pins 418a and 419a) are tested (e.g., along with testing the signal lines 422a and 424a). Subsequently, another pair of pins (e.g., 418b and 419M) are tested (e.g., along with testing the signal lines 422b and 424M). This process is repeated until all the pins of the connectors 112 and 116b are tested.

In some embodiments, while testing the pins 418a and 419a, the generator 410 generates a sequence of pseudo random bits using, for example, a specific seed, e.g., seed A. The test card 128b transmits the sequence via the pin 418a of the connector 116b. The sequence of pseudo random bits is transmitted via the signal line 422a and via the loopback trace 426a of the test card 128b to the component 444. The component 444 is configured (e.g., by the test engine 220) to electrically couple the pins 418a and 419a. Accordingly, the sequence is received by the test card 128b via the component 444, the loopback trace 427a, and the pin 419a of the connector 116b.

The generator 414 also generates a sequence of pseudo random bits using the same seed A (e.g., which was used by the generator 410 to generate the sequence of pseudo random bits). In an example, the two generators 410 and 414 generate the same sequence of pseudo random bits (e.g., although the generator 414 generates the pseudo random bits with some delay relative to the generation of the pseudo random bit by the generator 310). Accordingly, ideally (e.g., if the pins 418a and 419a, and the signal lines 422a and 424a are operating as intended), the sequence of pseudo random bits generated by the generator 414 will substantially match with the sequence received over the signal line 424a. In some embodiments, the generator 414 is initially stopped or not activated (e.g., when the generator 410 starts generating the pseudorandom bits, which are transmitted over the signal line 422a). Upon detecting a specific pattern within the pseudo random bits received over the signal line 424a, the generator 414 is enabled or activated. This establishes a synchronization between the generator 410 and the generator 414. Once the synchronization has been established, a comparison circuit 428 on the test card 128b is activated.

The comparison circuit 428 is configured to compare the sequence of pseudo random bits generated by the generator 414 with the sequence of pseudo random bits received over the signal line 424a. In some embodiments and as discussed above, the generator 414 generates the sequence of pseudo random bits with some delay relative to the sequence of pseudo random bits generated by the generator 410. In some other embodiments, when the comparison circuit 428 compares the sequence of pseudo random bits generated by the generator 414 with the sequence of pseudo random bits received over the signal line 424a, the comparison circuit 428 may time shift one of the sequences (or perform another appropriate signal processing function) to account for the delay in the transmission of the sequence via the signal lines 422a, 424a, the component 444, and the loopback traces 426a, 427a. In some embodiments, if the two sequence matches, this implies that the pins 418a and 419a of the connectors 112 and 116b, and the signal lines 422a and 424a are operating as intended. On the other hand, if the two sequence does not match, this implies a possible fault in one or more of the pins 418a and 419a of the connectors 112 and 116b, and the signal lines 422a and 424a. In some embodiments, the result of comparison is transmitted to the test engine 220, where the test engine 220 analyses the results to infer whether these components are operating as intended.

In some embodiments and as illustrated in FIG. 4A, the connectors 112 and 116b may also communicate test signals via signal lines 440. During a regular operation of the board 104 (e.g., when a processor IC is attached to the connector 112 and a PCIe card is attached to the connector 116b), the signal lines 440, for example, is used to transmit signals associated with the operation of the PCIe card. However, while testing the board 104 (e.g., when the test board 126 is attached to the connector 112 and the test card 128b is attached to the connector 116b), the signal lines 440 are used for transmitting signals associated with testing the board 104. The test signals can be of any appropriate type, e.g., to indicate a start of a test, to acknowledge a completion of a test, to transmit a result of the test from the comparison circuit 428 to the test board 126, etc. In some embodiments, the data pattern, the data rate, and/or the length of the sequence of pseudorandom bits generated by the generators 410 and 414 can be programmed by the test engine 220 via the signal lines 440.

In some embodiments and although not illustrated in FIG. 4A, the generators 410 and 414, and the comparison circuit 428 can be placed within the test board 126, e.g., instead of the test card 116b. In such embodiments, the loopback traces 426a, ..., 426M, 427a, ..., 427M, and the component 444 may be placed within the test card 128b.

In some embodiments and although not illustrated in FIG. 4A, the test card 128b can include a single PRBS generator (e.g., the generator 410). For example, the single generator can generate and transmit the sequence of pseudorandom bits, and temporarily store the sequence of bits in a memory or register within the test card 128b. The comparison circuit 428 can then compare the sequence of bits received over the signal line 424a with the sequence of bits stored in the memory or register within the test card 128b, thereby eliminating the need of two generators within the test card 128b.

In some embodiments, the testing of the connectors 112 and 116b can be used for both direct current (DC) and alternating current (AC) coupled circuits. For example, one or more traces (e.g., a PCIe trace corresponding to the signal line 422a) on the board 104 may have a coupling capacitor (not illustrated in FIG. 4A) that may block the DC voltages, but allow the pseudorandom bits generated by the generator 410 to propagate through the capacitor.

Figure 4B:
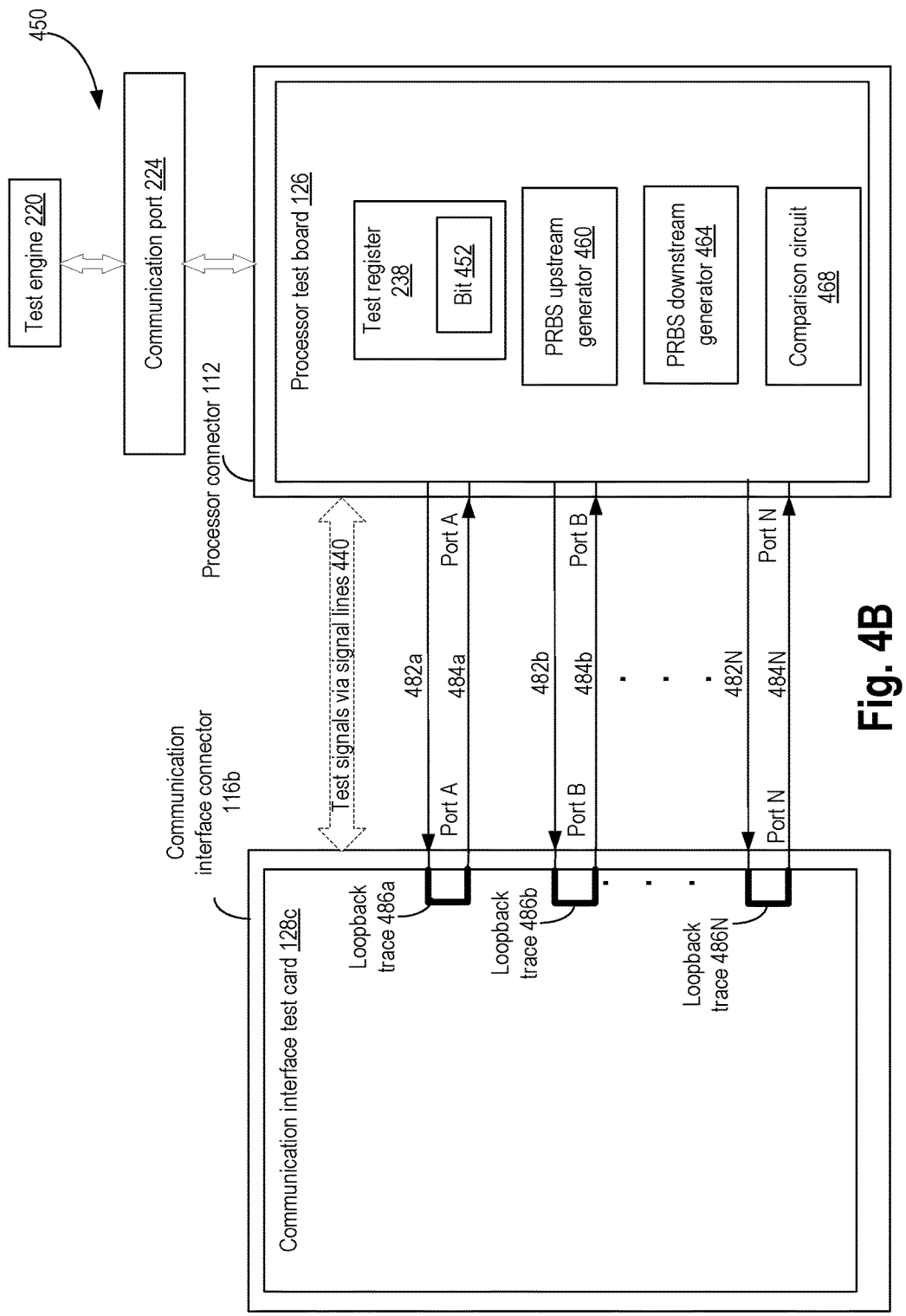
FIG. 4B illustrates an arrangement for PRBS testing of a board assembly using a communication interface test card, where a plurality of loopback traces are in the communication interface test card, according to some embodiments.

In FIG. 4A, the generators 410 and 414 are in the test card 128b, and the loopback traces 426 are in the test board 126. However, as previously alluded to, this configuration can be reversed. FIG. 4B illustrates an arrangement 450 for PRBS testing of the board 104 using a communication interface test card (e.g., a communication interface test card 128c), where loopback traces 486a, ..., 486N are in the test card 128c, according to some embodiments. In the arrangement 450, the test board 126 within the connector 112 includes a PRBS upstream generator 460, a PRBS downstream generator 464, and a comparison circuit 468. The test board 126 transmits a first sequence of pseudorandom bits generated by the generator 460 over, for example, a signal line 482a, which is looped back in the test card 128c by a loopback trace 486a, and received by the test board 126 over a signal line 484a. The comparison circuit 468 compares the sequence of bits received over the signal line 484a with a second sequence of pseudorandom bits generated by the generator 464, and transmits the comparison result to the test engine 220. The arrangement 450 of FIG. 4B would be apparent to those skilled in the art, based on the discussion associated with FIGS. 3 and 4A. Hence, a more detailed description of the arrangement 450 is not provided herein.

In FIG. 4B, the test board 126 communicates with the test engine 220 via the communication port 224, and communicates with the test card 128c via the signal lines 482a, 484a, ..., 482N, 484N. In some examples, the test card 128c can act merely as a loopback card, e.g., has functionality to merely loop back signals via loopback traces 486a, ..., 486N, without having any active circuits for testing. In some embodiments (and unlike FIG. 4A), the test card 128c may not communicate any test signals over the signal lines 440 with the test board 126. Accordingly, in FIG. 4B, the signal lines 440 are illustrated using dotted lines (e.g., to indicate that transmission of test signals via the signal lines 440 are optional). In some embodiments, the test card 128c and the test board 126 may not even be connected using the signal lines 440.

Figure 5:
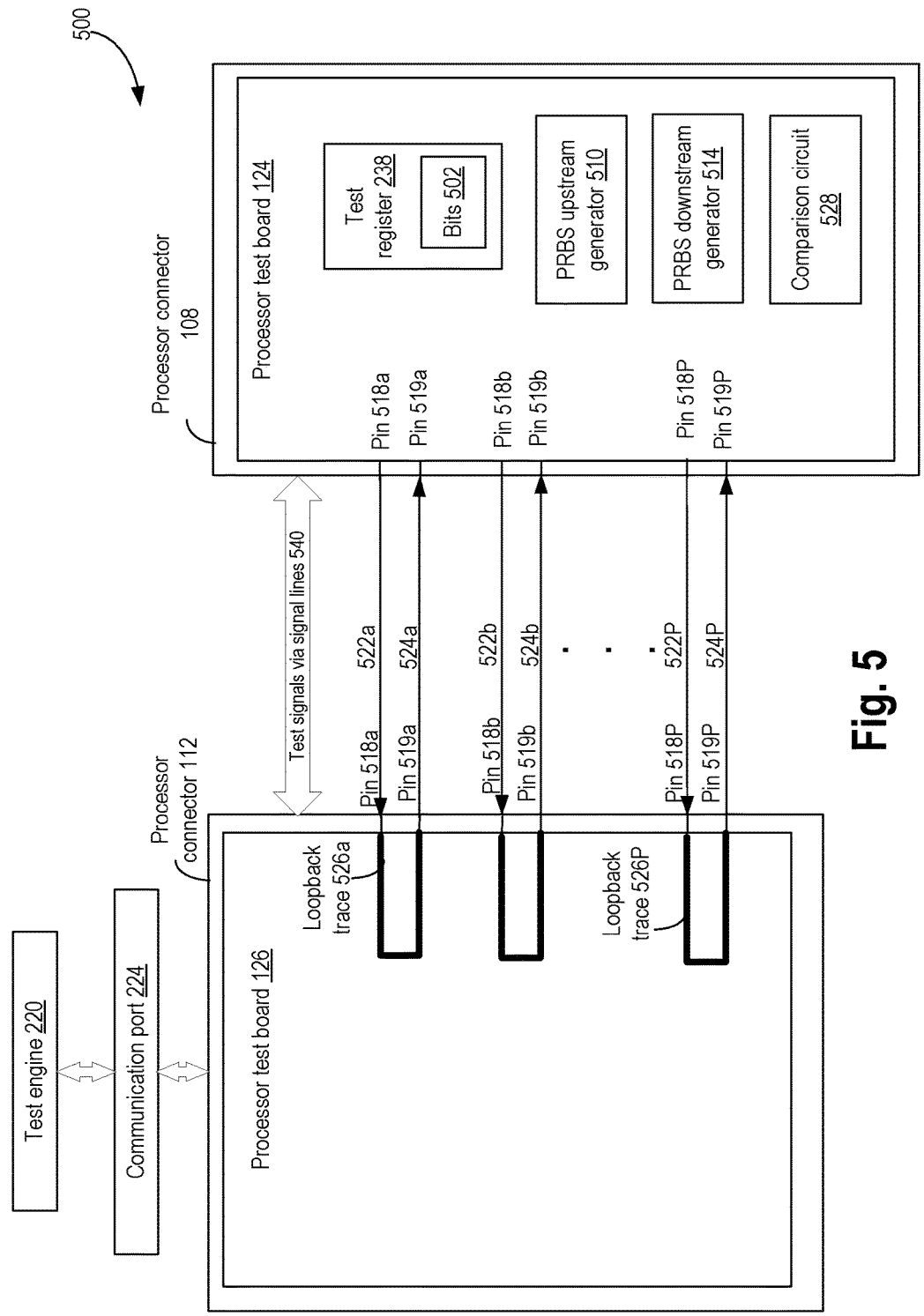
FIG. 5 illustrates an arrangement for PRBS testing of a board assembly using two test boards, according to some embodiments.

FIG. 5 illustrates an arrangement 500 for PRBS testing of the board 104 using two test boards 124 and 126, according to some embodiments. In the arrangement 500, the test board 126 within the connector 112 communicates with the test board 124 within the connector 108. As discussed with respect to FIG. 2, both the test boards 124 and 126 comprise corresponding test registers, although only one test register (e.g., test register 238 in test board 124, although in another example, the test register 238 can be in the test board 126 instead) is illustrated in FIG. 5 (e.g., as this test register may be used to program the test using the two test boards). In some embodiments, the test register 238 comprises a bit 502, where the bit 502 can be programmed by, for example, the test engine 220. When the test boards 126 and 124 are to be used for testing, the bit 502 is enabled (e.g., set to 1), else this bit is disabled (e.g., set to 0).

In an example, each of the connectors 108 and 112 comprises corresponding pins 518a, ..., 518P, 519a, ..., 519P. For example, the pins 518a of the two connectors are coupled via a signal line 522a, the pins 519a of the two connectors are coupled via a signal line 524a, and so on, as illustrated in FIG. 5.

Furthermore, the pins 518a and 519a in the test board 126 are coupled via loopback trace 526a, and so on, as illustrated in FIG. 5. In some embodiments, the test board 124 comprises a PRBS upstream generator 510 (henceforth also referred to as "generator 510") and a PRBS downstream generator 514 (henceforth also referred to as "generator 514"), and a comparison circuit 528. Each of the generators 510 and 514 generates a corresponding sequence of random or pseudo random bits, e.g., based on a seed. In some embodiments, while testing the pins 518a and 519a, the generator 510 generates a sequence of pseudo random bits using, for example, a specific seed. The sequence is looped back via the test board 126, and returns to the test board 124 via the signal line 524a. In some embodiments and similar to the set up discussed with respect to FIGS. 3-4B, the generator 514 may be initially stopped or not activated. Upon detecting a specific pattern within the pseudo random bits received over the signal 524a, the generator 514, for example, is enabled. In some embodiments, this establishes a synchronization between the generator 510 and the generator 514. In some embodiments, once the synchronization has been established, the comparison circuit 528 can be activated. The comparison circuit 528 compares the sequence of pseudo random bits generated by the generator 514 with the sequence of pseudo random bits received over the signal line 524a, and generates a test result, which, for example, is transmitted to the test engine 220.

In some embodiments and although not illustrated in FIG. 5, in addition to (or instead of) the generators 510 and 514 and the comparators 518 in the test board 124, the test board 126 can also include similar components (e.g., can include a PRBS upstream generator, a PRBS downstream generator, and a comparison circuit). The generators and the comparison circuits in the test board 126 are configured to drive and test at least some of the signal lines between the test board 126 and test board 124 (e.g., one or more signal lines not illustrated in FIG. 5). In some embodiments, about half of the signal lines between the test boards 124 and 126 are tested using the generators 510 and 514 and the and comparison circuit 528 in the test board 124; and about half of the signal lines between the test boards 124 and 126 are tested using generators and a comparison circuit (not illustrated in FIG. 5) in the test board 126.

An operation of the arrangement 500 of FIG. 5 would be readily apparent to those skilled in the art from the operation of the arrangement 300 of FIG. 3, and hence, the operation of the arrangement 500 of FIG. 5 is not elaborated in further details.

Each of FIGS. 3, 4A, 4B, and 5 illustrate a PRBS upstream generator and a PRBS downstream generator included in a single test board or a single test card. For example, FIG. 3 illustrates the generators 310 and 314 being included in a single test card 132a, with the test board 126 not including any such generator. However, in some other embodiments (and although not illustrated in the figures), the PRBS upstream generator and the PRBS downstream generator can be respectively included in two different test boards/cards.

Merely as an example, FIG. 3 can be modified such that the generator 310 is included in the test card 132a, while the generator 314 is shifted and included in the test board 126. In an example, the comparison circuit 318 can be included in the test board 126. In another example, each of the test board 126 and the test card 132a can have two corresponding comparison circuits. Such an arrangement, for example, can be used, at a given time, for testing the signal line 322a (e.g., as opposed to the arrangement of FIG. 3, where at a given time, the signal line pairs 322a and 324a are tested). For example, the generator 310 on the test card 132a can generate and transmit a sequence of pseudorandom bits over the signal line 322a to the test board 126. The generator 314 on the test board 126 can generate a similar sequence of pseudorandom bits. The comparison circuit 318 on the test board 126 can compare the sequence of pseudorandom bits received over the signal line 322a with the sequence of pseudorandom bits generated by the generator 314, based on which the integrity of the signal line 322a can be tested and verified. In a similar (but opposing) manner, the signal line 324a can also be tested and verified. In some embodiments, the arrangements in FIGS. 4A, 4B and 5 can also be appropriately modified to include a PRBS upstream generator in a first test board/card and a PRBS downstream generator in a second test board/card.

Figure 6:
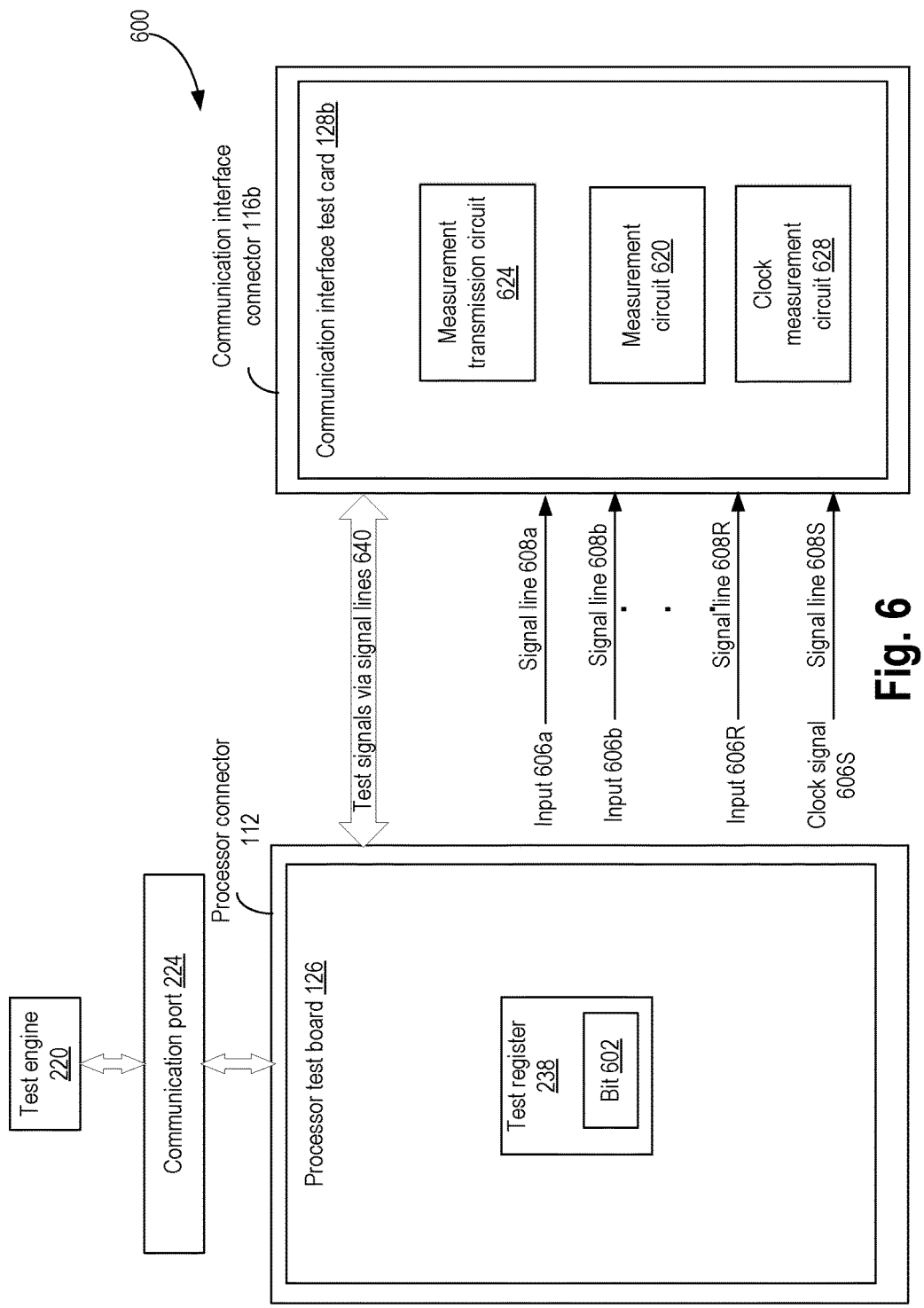
FIG. 6 illustrates an arrangement for testing signals originating from a board assembly, according to some embodiments.

FIG. 6 illustrates an arrangement 600 for testing signals originating from the board 104, according to some embodiments. In the arrangement 600, the test card 128b is inserted in the connector 116b. The test card 128b receives, via the connector 116b, input signals 606a, 606b, . . . , 606R. The connector 116b receives the input signals 606a, 606b, . . . , 608R via corresponding signal lines 608a, 608b, . . . , 608R. In some embodiments, the input signals 606a, 606b, . . . , 606R are generated by one or more components disposed within the board 104, or are otherwise accessed by the board 104 and supplied to the connector 116b. In an example, the input signals 606a, . . . , 606R comprises signals from a power plane, a ground plane, etc. The signals 606a, . . . , 606R may be generated or supplied from one or more active or passive components (not illustrated in FIG. 6) disposed on the board 104.

In some embodiments, the test register 238 in the test board 126 comprises a bit 602 that is selectively enabled to enable testing one or more of the input signals 606a, . . . , 606R using the test card 128b. In some embodiments, the test card 128b comprises a measurement circuit 620. The signal measurement circuit 620 measures one or more attributes of one or more of the input signals 606a, . . . , 606R. For example, the signal measurement circuit 620 measures a voltage level of the input signal 606a.

In an example, at least some of the input signals 606a, . . . , 606R (e.g., input signal 606a and 606b) are static in nature, e.g., does not substantially change while the measurement circuit 620 measures the attributes of the input signals. In another example, some of the input signals 606a, . . . , 606R can be dynamic, unstable and/or unpredictable while the measurement circuit 620 measures the attributes of the input signals.

In some embodiments, the measurement circuit 620 measures attributes of only those input signals that are static. For example, the measurement circuit 620 measures attributes of input signals 606a and 606b, which are static or have a relative fixed voltage level. In some embodiments, for the input signals that can be dynamic, unstable and/or unpredictable while the measurement circuit 620 measures the attributes of the input signals, the measurement circuit 620 masks such input signals (e.g. ignores such input signals, do not measure the attributes of such input signals, and/or ignores the measurement values of such input signals).

In some embodiments, the test card 128b further comprises a measurement transmission circuit 624 configured to transmit the measured attributes of the input signals 606a and 606b to the test board 126, e.g., via signal lines 640. The test board 126, for example, re-transmits the measured attributes of the input signals 606a and 606b to the external test engine 220.

In some embodiments, an input signal (e.g., the input signal 606a) has an expected value, e.g., between 0.78 volts (V) to 0.85 V. The test engine 220 compares the expected value of the input signal 606a to the measured value of the input signal 606a (e.g., as measured by the measurement circuit 620). If the measured value is within a range of the expected value, this implies that the input signal 606a, the signal line 608a, and a pin of the connector 116b receiving the input signal 606a are operating as intended. On the other hand, if the measured value is substantially different from range of the expected value, this implies that one or more of the input signal 606a, the signal line 608a, and the pin of the connector 116b receiving the input signal 606a can possibly be faulty.

In some embodiments, the connector 116b also receives a clock signal 606S via a signal lines 608S. In an example, the clock signal 606S is generated by a clock generation circuit (not illustrated in FIG. 6) disposed on the board 104. In some embodiments, the test card 128b comprises a clock measurement circuit 628 that measures one or more attributes of the clock signal 606S. For example, the clock measurement circuit 628 measures a frequency of the clock signal 606S, a jitter in the clock signal 606S, and/or the like. The measurement transmission circuit 624 is configured to transmit the measured attributes of the clock signal 606S to the test board 126, e.g., via signal lines 640. The test board 126, for example, re-transmits the measured attributes of the clock signal 606S to the external test engine 220. The test engine 220 analyzes the attributes to determine if the measured attributes are within an acceptable level. If the measured attributes are outside acceptable level, the test engine 220 indicates a potential fault condition in one or more of the clock signal 606S, the signal line 608S, and/or a pin of the connector 116b receiving the clock signal 606S.

Although FIG. 6 illustrates using the test card 128b to test the connector 116b, similar tests can be performed using any other test cards or test boards (e.g., test cards 132a, 132b, 128a, test boards 124, 126, etc.). Such tests using another test card would be apparent in view of FIG. 6 and associated discussion, and hence, is not discussed in further details herein.

Figure 7:
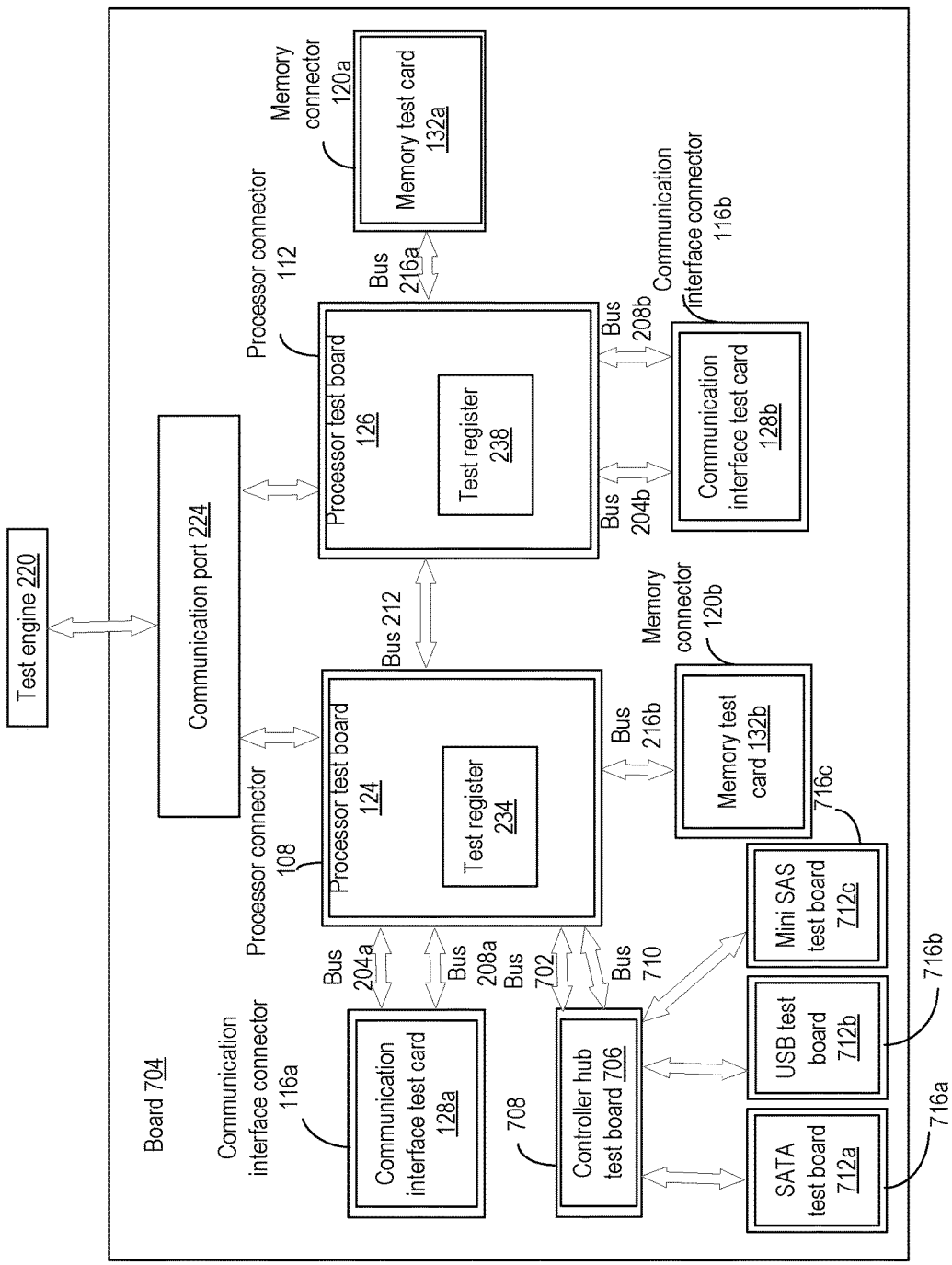
FIG. 7 schematically illustrates another arrangement for testing a board assembly, according to some embodiments.

FIG. 2 illustrated few example connectors of the board 104. However, the board can include numerous other types of connectors. For example, FIG. 7 schematically illustrates an arrangement 700 for testing a board 704, according to some embodiments. The board 704 of FIG. 7 is similar to the board 104 of FIG. 2—however, unlike the board 104, the board 704 comprises a controller hub test board 706 attached to a corresponding connector 708. In an example, the connector 708 is configured to receive a Platform Control Hub (PCH) during a regular operation of the board 704, and to receive the test board 706 while the board 704 is being tested. In some embodiments, the connector 708 is connected to the connector 108 via, for example, buses 702 and 710. The buses 702 and 710, in an example, are a PCIe bus and a direct media interface (DMI) bus, respectively.

In some embodiments, the connector 708 is connected to a serial AT attachment (SATA) connector 716a configured to receive a SATA card during a regular operation of the board 704, and to receive a SATA test board 712a while the board 704 is being tested. In some embodiments, the connector 708 is connected to a USB connector 716b configured to receive a USB device during a regular operation of the board 704, and to receive a USB test board 712b while the board 704 is being tested. In some embodiments, the connector 708 is connected to a mini serial attached SCSI (SAS) connector 716c configured to receive a mini SAS device during a regular operation of the board 704, and to receive a mini SAS test board 712c while the board 704 is being tested.

In some embodiments, the connectors 708, 716a, 716b, and/or 716c (and possible any additional connector connected to the connector 708) can be tested using the corresponding test boards, e.g., by employing one or more techniques discussed herein above. Accordingly, the testing of the board 704 is not discussed in further details herein.

Figure 8:
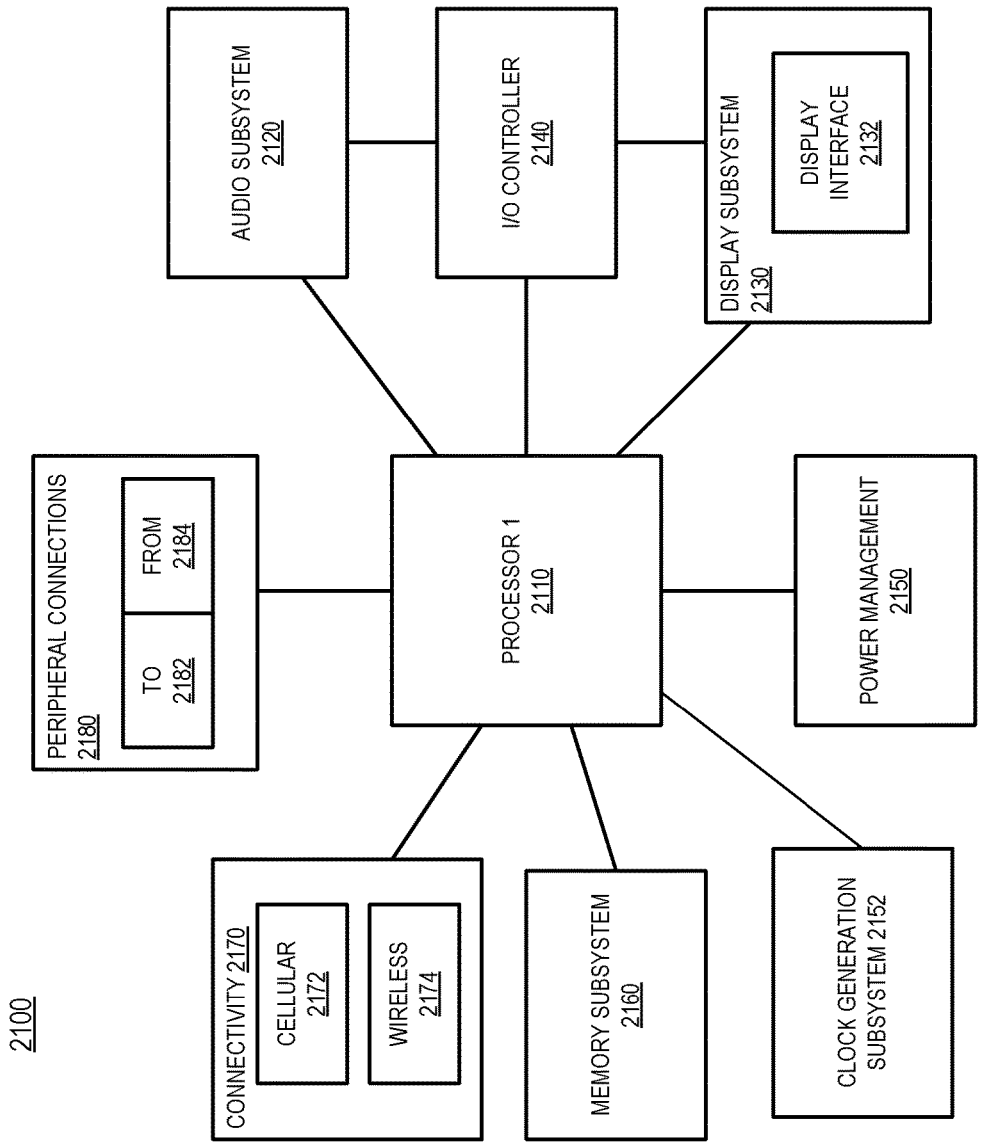
FIG. 8 illustrates a smart device or a computer system or a SoC (System-on-Chip), where one or more components of the device is formed on one of the board assemblies of FIGS. 1-6, in accordance with some embodiments.

FIG. 8 illustrates a smart device or a computer system or a SoC (System-on-Chip) 2100, where one or more components of the device 2100 is formed on the board 104 of FIGS. 1-6 or the board 704 of FIG. 7, in accordance with some embodiments. It is pointed out that those elements of FIG. 8 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, one of more components of the computing device 2100 is attached to a board assembly, e.g., the board 104 of FIGS. 1-6 or the board 704 of FIG. 7. For example, the processor 2110 (e.g., along with one or more other components) is included in an IC that is inserted in a processor connector (e.g., processor connector 108 or 112) during a regular operation of the board assembly. A memory device of the memory subsystem 2160 is, for example, inserted in the memory connector 120 during a regular operation of the board assembly. A PCIe card (e.g., included in the peripheral connections 2180, the connectivity subsystem 2170, or the like) is, for example, inserted in the communication interface connector 116 of the board 104 during a regular operation of the board assembly.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following example clauses pertain to further embodiments. Specifics in the examples clauses may be used anywhere in one or more embodiments. All optional features of the apparatus described herein may also be implemented with respect to a method or process.

Clause 1: A testing arrangement comprising: a board assembly comprising (i) a first connector configured to receive a first component while the board assembly is to operate in a regular mode of operation and (ii) a second connector configured to receive a second component while the board assembly is to operate in the regular mode of operation; a first test card configured to be attached to the first connector while the board assembly is to operate in a test mode of operation; and a second test card configured to be attached to the second connector while the board assembly is to operate in the test mode of operation, wherein while the board assembly is to operate in the test mode of operation, the first test card is configured to communicate with the second test card to facilitate testing of the board assembly.

Clause 2: The testing arrangement of clause 1, further comprising: a test engine that is positioned external to the board assembly, wherein the test engine is configured to program the first test card and the second test card to facilitate testing of the board assembly and to receive a result of testing the board assembly.

Clause 3: The testing arrangement of any of clauses 1 or 2, wherein the second test card comprises: a first pseudorandom bit sequence (PRBS) generator configured to generate a first sequence of pseudorandom bits, wherein the second test card is configured to (i) transmit the first sequence of pseudorandom bits to the first test card, and (ii) receive, in response to transmitting the first sequence of pseudorandom bits to the first test card, a second sequence of pseudorandom bits from the first test card; a second PRBS generator configured to generate a third sequence of pseudorandom bits; and a comparison circuit configured to compare the second sequence of pseudorandom bits and the third sequence of pseudorandom bits, wherein the comparison circuit is configured to transmit a result of the comparing to a test engine external to the board assembly.

Clause 4: The testing arrangement of clause 3, wherein the third sequence of pseudorandom bits is substantially similar to the first sequence of pseudorandom bits.

Clause 5: The testing arrangement of any of clauses 3 or 4, wherein the first test card comprises: a first pin configured to receive the first sequence of pseudorandom bits from the second test card; a loopback trace coupling the first pin of the first test card to a second pin of the first test card; and the second pin configured to receive the first sequence of pseudorandom bits from the second test card via the first pin and the loopback trace, and to transmit the received first sequence of pseudorandom bits as the second sequence of pseudorandom bits to the second test card.

Clause 6: The testing arrangement of any of clauses 3, 4, or 5, wherein the first test card comprises: a first pin configured to receive the first sequence of pseudorandom bits from the second test card; a reconfigurable switch configured to selectively couple the first pin of the first test card to a second pin of the first test card, based on a signal received from a test engine that is external to the board assembly; and the second pin configured to receive the first sequence of pseudorandom bits from the second test card via the first pin and the reconfigurable switch, and to transmit the received first sequence of pseudorandom bits as the second sequence of pseudorandom bits to the second test card.

Clause 7: The testing arrangement of clause 1, wherein: the board assembly further comprises a third connector configured to receive a third component while the board assembly is to operate in the regular mode of operation; and a third test card configured to be attached to the third connector while the board assembly is to operate in the test mode, wherein while the board assembly is to operate in the test mode, the first test card is configured to communicate with the third test card to facilitate testing of the board assembly.

Clause 8: The testing arrangement of clause 1, wherein the second test card comprises: a first pin configured to receive a first signal that originates from the board assembly; a circuit configured to measure a voltage level of the first signal; and a second pin configured to transmit the measured voltage level of the first signal to the first test card, to facilitate the first test card to transmit the measured voltage level of the first signal to a test engine external to the board assembly.

Clause 9: The testing arrangement of any of clauses 1-8, wherein: the first component comprises an integrated circuit including a central processing unit (CPU); and the second component comprises one of a memory device or a Peripheral Component Interconnect Express (PCIe) card.

Clause 10: A first test card comprising: a first pseudorandom bit sequence (PRBS) generator configured to generate a first sequence of pseudorandom bits, wherein the first test card is configured to be inserted in a first connector of a board assembly while the board assembly is to operate in a test mode of operation, wherein the first test card is further configured to transmit the first sequence of pseudorandom bits to a second test card that is configured to be inserted in a second connector of the board assembly while the board assembly is to operate in the test mode of operation, and wherein the first test card is configured to receive a second sequence of pseudorandom bits from the second test card; a second PRBS generator configured to generate a third sequence of pseudorandom bits; and a comparison circuit configured to compare the second sequence of pseudorandom bits and the third sequence of pseudorandom bits to generate a comparison result.

Clause 11: The first test card of clause 10, wherein the first test card is further configured to transmit the comparison result to a test engine external to the board assembly.

Clause 12: The first test card of any of clauses 10 or 11, wherein: the first PRBS generator is configured to utilize a first seed to generate the first sequence of pseudorandom bits; and the second PRBS generator is configured to utilize the first seed to generate the third sequence of pseudorandom bits such that the first sequence of pseudorandom bits is substantially same as the third sequence of pseudorandom bits.

Clause 13: The first test card of any of clauses 10-12, wherein: in response to the comparison result indicating that the second sequence of pseudorandom bits does not match the third sequence of pseudorandom bits, the test engine is configured to indicate a fault condition in one or more of the first connector, the second connector, or one or more signal lines between the first connector and the second connector.

Clause 14: The first test card of any of clauses 10-13, further comprising: a first pin configured to receive a first signal that originates from the board assembly; a circuit configured to measure a voltage level of the first signal; and a second pin configured to transmit the measured voltage level of the first signal to the second test card, to facilitate the second test card to transmit the measured voltage level of the first signal to a test engine positioned external to the board assembly.

Clause 15: The first test card of any of clauses 10-14, further comprising: a first pin configured to receive a clock signal that is to originate from the board assembly; a circuit configured to measure one or more characteristics of the clock signal; and a second pin configured to transmit the measured one or more characteristics of the clock signal to the second test card, to facilitate the second test card to transmit the measured one or more characteristics of the clock signal to a test engine external to the board assembly.

Clause 16: The first test card of any of clause 10-15, wherein: a memory device is configured to be inserted in the first connector of the board assembly while the board assembly is to operate in a regular mode of operation; and an integrated circuit (IC) comprising a central processing unit (CPU) which is configured to be inserted in the second connector of the board assembly while the board assembly is to operate in the regular mode of operation.

Clause 17: A system comprising: a board assembly comprising a first connector and a second connector; a processing core configured to be attached to the first connector while the board assembly is to operate in a first mode of operation; a memory configured to be attached to the second connector while the board assembly is to operate in the first mode of operation; a first test card configured to be attached to the first connector while the board assembly is to operate in a second mode of operation; and a second test card configured to be attached to the second connector while the board assembly is to operate in the second mode of operation, wherein while the board assembly is to operate in the second mode of operation, the first test card is configured to communicate with the second test card to facilitate testing of the board assembly.

Clause 18: The system of clause 17, wherein the first test card comprises: a first pseudorandom bit sequence (PRBS) generator configured to generate a first sequence of pseudorandom bits, wherein the first test card is configured to (i) transmit the first sequence of pseudorandom bits to the second test card, and (ii) receive a second sequence of pseudorandom bits from the second test card; and a second PRBS generator configured to generate a third sequence of pseudorandom bits.

Clause 19: The system of any of clause 18, wherein the first test card further comprises: a comparison circuit configured to compare the second sequence of pseudorandom bits and the third sequence of pseudorandom bits, wherein the comparison circuit is configured to transmit a result of the comparing to a test engine external to the board assembly.

Clause 20: The system of clause 19, wherein: in response to the comparison result indicating that the second sequence of pseudorandom bits does not match the third sequence of pseudorandom bits, the test engine is configured to indicate a fault condition in one or more of the first connector, the second connector, or one or more signal lines between the first connector and the second connector.

Clause 21: The system of clause 20, wherein the third sequence of pseudorandom bits is substantially similar to the first sequence of pseudorandom bits.

Clause 22: The system of any of clauses 17-21, wherein the board assembly is coupled to a test engine that is external to the board assembly.

Clause 23: The system of any of clauses 17-21, wherein the board assembly is configured to transmit test results to the test engine.

Clause 24: The system of any of clauses 17-21, wherein the board assembly is configured to receive instructions from the test engine to conduct one or more tests.

Clause 25: A system for testing a board assembly, the system comprising: a testing arrangement according to one of the clauses 1 to 10; a test engine coupled to the testing arrangement, the test engine configured to communicate with the testing arrangement to receive test results from the testing arrangement.

Clause 26: A method comprising: generating, by a first pseudorandom bit sequence (PRBS) generator included in a first test card, a first sequence of pseudorandom bits, wherein the first test card is configured to be inserted in a first connector of a board assembly while the board assembly is to operate in a test mode of operation; transmitting, by the first test card, the first sequence of pseudorandom bits to a second test card that is configured to be inserted in a second connector of the board assembly while the board assembly is to operate in the test mode of operation; receiving, by the first test card, a second sequence of pseudorandom bits from the second test card; generating, by a second PRBS generator included within the first test card, a third sequence of pseudorandom bits; and comparing, by a comparison circuit, the second sequence of pseudorandom bits and the third sequence of pseudorandom bits to generate a comparison result.

Clause 27: The method of clause 26, further comprising: transmitting, by the first test card, the comparison result to a test engine external to the board assembly; utilizing, by the first PRBS generator, a first seed to generate the first sequence of pseudorandom bits; and utilizing, by the second PRBS generator, the first seed to generate the third sequence of pseudorandom bits such that the first sequence of pseudorandom bits is substantially same as the third sequence of pseudorandom bits.

Clause 28: The method of clause 26, wherein: in response to the comparison result indicating that the second sequence of pseudorandom bits does not match the third sequence of pseudorandom bits, indicating, by the test engine, a fault condition in one or more of the first connector, the second connector, or one or more signal lines between the first connector and the second connector.

Clause 29: The method of clause 26, further comprising: receiving, by a first pin included in the first test card, a first signal that originates from the board assembly; measuring, by a circuit included in the first test card, a voltage level of the first signal; and transmitting, by a second pin included in the first test card, the measured voltage level of the first signal to the second test card, to facilitate the second test card to transmit the measured voltage level of the first signal to a test engine positioned external to the board assembly.

Clause 30: The method of clause 26, further comprising: receiving, by a first pin included in the first test card, a clock signal that is to originate from the board assembly; measuring, by a circuit included in the first test card, one or more characteristics of the clock signal; and transmitting, by a second pin included in the first test card, the measured one or more characteristics of the clock signal to the second test card, to facilitate the second test card to transmit the measured one or more characteristics of the clock signal to a test engine external to the board assembly.

Clause 31: The method of clause 26, further comprising: inserting a memory device in the first connector of the board assembly while the board assembly is to operate in a regular mode of operation; and inserting an integrated circuit (IC) comprising a central processing unit (CPU) in the second connector of the board assembly while the board assembly is to operate in the regular mode of operation.

Clause 32: An apparatus comprising means to perform a method of any of the preceding method clauses.

Clause 33: Machine-readable storage including machine-readable instructions, when executed, to implement a method or realize an apparatus of any preceding clauses.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A testing arrangement comprising:
    a board assembly comprising:
        a first connector to receive a first component while the board assembly is to operate in a regular mode of operation; and
        a second connector to receive a second component while the board assembly is to operate in the regular mode of operation;
    a first test card to be attached to the first connector while the board assembly is to operate in a test mode of operation; and
    a second test card to be attached to the second connector while the board assembly is to operate in the test mode of operation,
    wherein while the board assembly is to operate in the test mode of operation, the first test card is to communicate with the second test card to facilitate testing of the board assembly.

2. The testing arrangement of claim 1, further comprising:
    a test engine positioned external to the board assembly, wherein the test engine is to program the first test card and the second test card to facilitate testing of the board assembly and to receive a result of testing the board assembly.

3. The testing arrangement of claim 1, wherein the second test card comprises:

a first pseudorandom bit sequence (PRBS) generator to generate a first sequence of pseudorandom bits, wherein the second test card is to:
        transmit the first sequence of pseudorandom bits to the first test card, and
        receive, in response to transmitting the first sequence of pseudorandom bits to the first test card, a second sequence of pseudorandom bits from the first test card;
    a second PRBS generator to generate a third sequence of pseudorandom bits; and
    a comparison circuit to compare the second sequence of pseudorandom bits and the third sequence of pseudorandom bits, wherein the comparison circuit is to transmit a result of the comparison to a test engine external to the board assembly.

4. The testing arrangement of claim 3, wherein the third sequence of pseudorandom bits is substantially similar to the first sequence of pseudorandom bits.

5. The testing arrangement of claim 3, wherein the first test card comprises:
    a first pin to receive the first sequence of pseudorandom bits from the second test card;
    a loopback trace to couple the first pin of the first test card to a second pin of the first test card; and
    the second pin to receive the first sequence of pseudorandom bits from the second test card via the first pin and the loopback trace, and to transmit the received first sequence of pseudorandom bits as the second sequence of pseudorandom bits to the second test card.

6. The testing arrangement of claim 3, wherein the first test card comprises:
    a first pin to receive the first sequence of pseudorandom bits from the second test card;
    a reconfigurable switch to selectively couple the first pin of the first test card to a second pin of the first test card, based on a signal received from a test engine that is external to the board assembly; and
    the second pin to receive the first sequence of pseudorandom bits from the second test card via the first pin and the reconfigurable switch, and to transmit the received first sequence of pseudorandom bits as the second sequence of pseudorandom bits to the second test card.

7. The testing arrangement of claim 1, wherein:
    the board assembly further comprises a third connector to receive a third component while the board assembly is to operate in the regular mode of operation; and
    a third test card to be attached to the third connector while the board assembly is to operate in the test mode,
    wherein while the board assembly is to operate in the test mode, the first test card is to communicate with the third test card to facilitate testing of the board assembly.

8. The testing arrangement of claim 1, wherein the second test card comprises:
    a first pin to receive a first signal that originates from the board assembly;
    a circuit to measure a voltage level of the first signal; and
    a second pin to transmit the measured voltage level of the first signal to the first test card, to facilitate the first test card to transmit the measured voltage level of the first signal to a test engine external to the board assembly.

9. The testing arrangement of claim 1, wherein:
    the first component comprises an integrated circuit including a central processing unit (CPU); and the second component comprises one of a memory device or a Peripheral Component Interconnect Express (PCIe) card.

10. A first test card comprising:
a first pseudorandom bit sequence (PRBS) generator to generate a first sequence of pseudorandom bits, wherein the first test card is to be inserted in a first connector of a board assembly while the board assembly is to operate in a test mode of operation, wherein the first test card is further to transmit the first sequence of pseudorandom bits to a second test card that is to be inserted in a second connector of the board assembly while the board assembly is to operate in the test mode of operation, and wherein the first test card is to receive a second sequence of pseudorandom bits from the second test card;
a second PRBS generator to generate a third sequence of pseudorandom bits; and
a comparison circuit to compare the second sequence of pseudorandom bits and the third sequence of pseudorandom bits to generate a comparison result.

11. The first test card of claim 10, wherein the first test card is further to transmit the comparison result to a test engine external to the board assembly.

12. The first test card of claim 10, wherein:
the first PRBS generator is to utilize a first seed to generate the first sequence of pseudorandom bits; and
the second PRBS generator is to utilize the first seed to generate the third sequence of pseudorandom bits such that the first sequence of pseudorandom bits is substantially same as the third sequence of pseudorandom bits.

13. The first test card of claim 10, wherein:
in response to the comparison result indicating that the second sequence of pseudorandom bits does not match the third sequence of pseudorandom bits, the test engine is to indicate a fault condition in one or more of the first connector, the second connector, or one or more signal lines between the first connector and the second connector.

14. The first test card of claim 10, further comprising:
a first pin to receive a first signal that originates from the board assembly;
a circuit to measure a voltage level of the first signal; and
a second pin to transmit the measured voltage level of the first signal to the second test card, to facilitate the second test card to transmit the measured voltage level of the first signal to a test engine positioned external to the board assembly.

15. The first test card of claim 10, further comprising:
a first pin to receive a clock signal that is to originate from the board assembly;
a circuit to measure one or more characteristics of the clock signal; and
a second pin to transmit the measured one or more characteristics of the clock signal to the second test card, to facilitate the second test card to transmit the measured one or more characteristics of the clock signal to a test engine external to the board assembly.

16. The first test card of claim 10, wherein:
a memory device is to be inserted in the first connector of the board assembly while the board assembly is to operate in a regular mode of operation; and
an integrated circuit (IC) comprising a central processing unit (CPU) which is to be inserted in the second connector of the board assembly while the board assembly is to operate in the regular mode of operation.

17. A system comprising:
a board assembly comprising a first connector and a second connector;
a processing core to be attached to the first connector while the board assembly is to operate in a first mode of operation;
a memory to be attached to the second connector while the board assembly is to operate in the first mode of operation;
a first test card to be attached to the first connector while the board assembly is to operate in a second mode of operation; and
a second test card to be attached to the second connector while the board assembly is to operate in the second mode of operation,
wherein while the board assembly is to operate in the second mode of operation, the first test card is to communicate with the second test card to facilitate testing of the board assembly.

18. The system of claim 17, wherein the first test card comprises:
a first pseudorandom bit sequence (PRBS) generator to generate a first sequence of pseudorandom bits, wherein the first test card is to:
transmit the first sequence of pseudorandom bits to the second test card, and
receive a second sequence of pseudorandom bits from the second test card;
a second PRBS generator to generate a third sequence of pseudorandom bits; and
a comparison circuit to compare the second sequence of pseudorandom bits and the third sequence of pseudorandom bits, wherein the comparison circuit is to transmit a result of the comparison to a test engine external to the board assembly.

19. The system of claim 18, wherein:
in response to the comparison result indicating that the second sequence of pseudorandom bits does not match the third sequence of pseudorandom bits, the test engine is to indicate a fault condition in one or more of the first connector, the second connector, or one or more signal lines between the first connector and the second connector.

20. The system of claim 19, wherein the third sequence of pseudorandom bits is substantially similar to the first sequence of pseudorandom bits.

21. The first test card of claim 10, wherein the second test card is to:
receive the first sequence of pseudorandom bits from the first test card; and
loop back and transmit the first sequence of pseudorandom bits as the second sequence of pseudorandom bits to the first test card.

* * * * *